United States Patent
Sumitani et al.

(10) Patent No.: US 7,277,342 B2
(45) Date of Patent: Oct. 2, 2007

(54) SEMICONDUCTOR MEMORY HAVING DUMMY BIT LINE PRECHARGE/DISCHARGE CIRCUIT

(75) Inventors: Norihiko Sumitani, Osaka (JP); Kazuki Tsujimura, Shiga (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 11/480,911

(22) Filed: Jul. 6, 2006

(65) Prior Publication Data

US 2007/0019485 A1    Jan. 25, 2007

(30) Foreign Application Priority Data

Jul. 6, 2005    (JP)    ............................. 2005-197881

(51) Int. Cl.
GIIC 7/02    (2006.01)
(52) U.S. Cl. ............... 365/210; 365/185.2; 365/185.25
(58) Field of Classification Search ................ 365/210, 365/185.2, 185.25
See application file for complete search history.

(56) References Cited

U.S. PATENT DOCUMENTS

| | | | |
|---|---|---|---|
| 6,690,608 B2* | 2/2004 | Nii et al. ..................... | 365/210 |
| 6,760,269 B2* | 7/2004 | Nakase et al. ............... | 365/210 |
| 6,804,153 B2* | 10/2004 | Yoshizawa et al. ..... | 365/189.07 |
| 6,982,899 B2* | 1/2006 | Sumitani et al. ............ | 365/154 |
| 2002/0159309 A1 | 10/2002 | Yamanaka | |
| 2005/0073885 A1 | 4/2005 | Suzuki et al. | |

FOREIGN PATENT DOCUMENTS

JP    2001-351385 A    12/2001

* cited by examiner

Primary Examiner—Tuan T. Nguyen
(74) Attorney, Agent, or Firm—McDermott Will & Emery LLP

(57) ABSTRACT

Reset dummy cells which change the load capacitance of a dummy read line DRD according to stored information are provided. Memory information are set to the reset dummy cells according to environmental factors, such as the temperature condition, voltage condition, etc. The timing of reading data from memory cells is controlled according to a change in voltage of the dummy read line DRD which is caused due to the discharge of the precharged dummy read line DRD.

15 Claims, 9 Drawing Sheets

| SET2 | SET1 | RESET | RESET CELL LOAD CAPACITANCE |
|---|---|---|---|
| 0 | 0 | 1 | 0 |
| 0 | 0 | 1 | 2 |
| ↓ | | | |
| 0 | 1 | 0 | |
| 0 | 0 | 1 | m-2 |
| ↓ | | | |
| 1 | 0 | 0 | |
| 1 | 1 | 0 | m |

SEMICONDUCTOR MEMORY HAVING DUMMY BIT LINE PRECHARGE/DISCHARGE CIRCUIT

CROSS-REFERENCE TO RELATED APPLICATIONS

This nonprovisional application claims priority under 35 U.S.C. §119(a) on Japanese Patent Application No. 2005-197881 filed on Jul. 6, 2005, and the entire contents disclosed in the specification, drawings and claims of this application are hereby incorporated by reference.

BACKGROUND OF THE INVENTION

1. Field of the Invention

The present invention relates to a semiconductor memory wherein a bit line is precharged to a predetermined potential for reading data.

2. Description of the Prior Art

In the semiconductor memory, the timing of activating a sense amplifier is sometimes varied due to the effects of variations in production which occur during formation of memory cell arrays over a silicon substrate, or variations in environmental factors, such as temperature condition, voltage condition, etc., and this variation in timing results in an unstable reading operation. An example of a semiconductor memory designed such that such effects are corrected to realize a stable reading operation is shown in FIG. 11. In the semiconductor memory 500 of FIG. 11, the timing of occurrence of a potential difference between bit lines is determined using actual memory cells (replica memory cells), and the sense amplifier is activated according to the determined timing (see Japanese Laid-Open Patent Publication No. 2001-351385 (page 6; FIG. 1)).

The semiconductor memory 500 includes a memory cell array 510, a predecoder 520, a word line driver 530, sense amplifiers 540, a replica column 550, an address logic circuit 560, and a column I/O logic circuit 570.

The memory cell array 510 includes a plurality of memory cells 511 arranged in a matrix configuration. A column of memory cells 511 are connected through a pair of bit lines to a corresponding one of the sense amplifiers 540.

The predecoder 520 decodes part of an address signal and outputs the result of the decoding to the word line driver 530.

The word line driver 530 activates a word line selected according to the address decode result of the predecoder 520.

The sense amplifiers 540 detects a voltage difference between the pair of bit lines according to an enable signal output from the column I/O logic circuit 570.

The replica column 550 includes a plurality of replica memory cells 551 aligned in a column direction and placed along a side of the memory cell array 510.

Each of the replica memory cells 551 is a replica of the memory cell 511 and has a pass transistor 551a. The gate terminal of the pass transistor 551a is connected to the address logic circuit 560 through a dummy word line. A predetermined number of replica memory cells 551 are connected to a pair of dummy bit lines which are connected to the column I/O logic circuit 570.

The column I/O logic circuit 570 detects a potential difference between the pair of dummy bit lines and outputs the result of the detection as an enable signal to the sense amplifiers 540.

In the above-described structure, when reading information stored in the memory cells 511, an input address is decoded by the address logic circuit 560 and the word line driver 530 to select a specific memory cell 511. The selected memory cell 511 produces a potential difference between the pair of bit lines.

Meanwhile, the address logic circuit 560 activates the gate terminals of the pass transistors 551a of a predetermined number of replica memory cells 551. As a result, an enable signal is output from the column I/O logic circuit 570. Since the replica memory cell 551 is a replica of the memory cell 511, the timing of occurrence of the potential difference between the dummy bit lines, i.e., the timing of outputting the enable signal, is substantially the same as the timing of occurrence of the potential difference between the bit lines of the memory cell 511. Receiving the enable signal, the sense amplifiers 540 detect the potential difference occurring between the pair of bit lines.

In the semiconductor memory 500, the timing of occurrence of a potential difference between the bit lines is determined using the replica column 550 as described above. Therefore, the effects of variations in production, temperature condition, voltage condition, etc., can be corrected.

When power reduction is required in a semiconductor integrated circuit, it can be achieved by decreasing the supply voltage. However, in general, the threshold voltage cannot be decreased so much in view of suppression of drain leakage of transistors. Therefore, when the semiconductor integrated circuit operates at a low voltage in a process of relatively-high threshold voltage, a variation in transistor performance becomes considerably large. Especially in memory cells of a semiconductor memory in which very small transistors are used, the variation is still larger.

Thus, when the timing generation function which uses the replica column 550 as in the semiconductor memory 500 operates at a low voltage near a threshold voltage, the transistor capacity of a memory cell can be far smaller than that of a corresponding replica memory cell, causing an error in the operation.

A possible way to avoid errors during a low voltage operation is to delay a timing using, for example, a delay circuit. However, this results in a redundant circuit structure and increases the circuit area.

SUMMARY OF THE INVENTION

The present invention was conceived in view of the above problems. An objective of the present invention is to provide a semiconductor memory capable of stable operation even when the performance of transistors used therein is varied due to the effects of decreased voltage, temperature variation, etc.

To achieve the above objective, the first embodiment of the present invention provides a semiconductor memory, comprising:

a memory cell array including memory cells arranged in a matrix configuration;

read word lines connected to rows of the memory cell array on a one-to-one basis, the read word lines transmitting a read control signal to the memory cells;

read lines connected to columns of the memory cell array on a one-to-one basis, the read lines transmitting information output from the memory cells;

a dummy cell array including a plurality of dummy memory cells for storing given information;

a dummy read line to which the plurality of dummy memory cells are commonly connected;

a dummy read line precharge circuit for precharging the dummy read line with charges; and a discharge circuit for discharging the charges of the dummy read line precharged by the dummy read line precharge circuit, wherein the dummy memory cells change the load capacitance of the dummy read line according to information stored therein, and reading of information from the memory cells is controlled according to a change in potential of the dummy read line due to the discharge of the discharge circuit.

With the above features, the load capacitance of the read line is changed according to memory information of the dummy memory cells. Therefore, for example, in a single bit line semiconductor memory, various timing signals for reading memory information from memory cells can be generated based on a change in potential due to the discharge of the read line.

According to the second embodiment of the present invention, in the semiconductor memory of the first embodiment,
  each of the memory cells includes
  a memory cell information storage section formed by two inverter circuits whose input terminals and output terminals are cross-linked to each other,
  a first memory cell transistor having a gate terminal connected to the read word line and a drain terminal connected to the read line, and
  a second memory cell transistor having a gate terminal connected to a connection point between the two inverter circuits, a drain terminal connected to a source terminal of the first memory cell transistor, and a source terminal connected to a first power supply; and
  each of the dummy memory cells includes
  a dummy memory cell information storage section formed by two inverter circuits whose input terminals and output terminals are cross-linked to each other,
  a first dummy memory cell transistor having a gate terminal connected to a ground and a source terminal connected to a second power supply, and
  a second dummy memory cell transistor having a drain terminal connected to the dummy read line, a source terminal connected to a drain terminal of the first dummy memory cell transistor, and a gate terminal connected to a connection point between the two inverter circuits of the dummy memory cell information storage section.

According to the third embodiment of the present invention, in the semiconductor memory of the first embodiment,
  the discharge circuit includes
  a first discharge transistor having a source terminal connected to a ground potential and a gate terminal connected to a third power supply, and
  a second discharge transistor having a drain terminal connected to the dummy read line and a source terminal connected to a drain terminal of the first discharge transistor; and
  the discharge of the discharge circuit is triggered by activation of the gate terminal of the second discharge transistor.

With the above features, the structure of a transistor used in the memory cell is the same as that of a transistor used in the dummy memory cell. Therefore, for example, in a single bit line semiconductor memory, the structure of the transistor of the memory cell can be used to construct the dummy memory cells and discharge circuit only by changing the wire arrangements.

According to the fourth embodiment of the present invention, in the semiconductor memory of the first embodiment, the first memory cell transistor, the second memory cell transistor, the first dummy memory cell transistor, and the second dummy memory cell transistor have the same shape.

With the above features, the characteristics of the memory cells and the characteristics of the dummy memory cells have similar variations.

According to the fifth embodiment of the present invention, in the semiconductor memory of the third embodiment, a potential of the third power supply is higher than that of the first power supply.

With the above features, the discharge time of the dummy read line can be prolonged.

According to the sixth embodiment of the present invention, in the semiconductor memory of the third embodiment, the first memory cell transistor, the second memory cell transistor, the first discharge transistor, and the second discharge transistor have the same shape.

With the above features, the characteristics of the memory cells and the characteristics of the discharge circuit have similar variations.

According to the seventh embodiment of the present invention, in the semiconductor memory of the second embodiment,
  the dummy memory cell further includes:
  a first information set transistor having a drain terminal connected to one of connection points of the two cross-linked inverter circuits and a source terminal connected to a ground potential, and
  a second information set transistor having a drain terminal connected to the other of the connection points of the two cross-linked inverter circuits and a source terminal connected to the ground potential; and
  information is stored in the dummy memory cell by controlling the potentials of the gate terminals of the first information set transistor and the second information set transistor.

With the above features, it is possible to store information in the dummy memory cells with small operations to change the load capacitance connected to the dummy read line.

According to the eighth embodiment of the present invention, the semiconductor memory of the first embodiment further comprises:
  write word lines connected to rows of the memory cells of the memory cell array on a one-to-one basis, the write word lines transmitting a write control signal to the memory cells; and
  a dummy write line to which the plurality of dummy memory cells are commonly connected, the dummy write line transmitting information which is to be written in the dummy memory cells,
  wherein the dummy memory cell is connected to the write word line and stores information input through the dummy write line according to a control signal input through the write word line.

With the above features, information can be stored in the dummy memory cells with small wiring resources through substantially the same operation as that performed for writing information in the memory cells, such that the load capacitance connected to the dummy read line is changed. Further, the dummy memory cells and the memory cells can have substantially the same shape.

According to the ninth embodiment of the present invention, the semiconductor memory of the first embodiment further comprises an output circuit for outputting information output to the read line according to a change in potential of the dummy read line due to the discharge of the discharge circuit.

With the above features, the activation of the output circuit (e.g., sense amplifier) is triggered by a change in voltage due to the discharge of the dummy read line. Therefore, the current consumption can be suppressed.

According to the tenth embodiment of the present invention, the semiconductor memory of the first embodiment further comprises a read line precharge circuit for precharging the read line with charges according to a change in potential of the dummy read line due to the discharge of the discharge circuit.

With the above features, the start of the precharge is triggered by a change in voltage due to the discharge of the dummy read line. Therefore, the precharge interruption time during which memory information is read from a memory cell can be suppressed as short as possible.

According to the eleventh embodiment of the present invention, in the semiconductor memory of the first embodiment, the read control signal is interrupted according to a change in potential of the dummy read line due to the discharge of the discharge circuit, such that the read word line is deactivated.

With the above features, interruption of a read control signal is triggered by a change in voltage due to the discharge of the dummy read line. Therefore, the period during which the read word line is active for reading memory information from a memory cell can be suppressed as short as possible.

According to the twelfth embodiment of the present invention, in the semiconductor memory of the first embodiment, information stored in the dummy memory cell is changed according to the temperature of the semiconductor memory.

With the above features, the load capacitance of the dummy read line is changed according to the temperature of the semiconductor memory. Therefore, for example, at a temperature which causes large variations in memory cells, the memory information of the dummy memory cells are changed to increase the load capacitance of the dummy read line such that the discharge time of the dummy read line is shortened, whereby various timing signals used for reading the memory information from the memory cells are optimized.

According to the thirteenth embodiment of the present invention, in the semiconductor memory of the first embodiment, information stored in the dummy memory cell is changed according to a supply voltage supplied to the semiconductor memory.

With the above features, the load capacitance of the dummy read line is changed according to the supply voltage of the semiconductor memory. Therefore, at a voltage which causes large variations in memory cells, the memory information of the dummy memory cells are changed to increase the load capacitance of the dummy read line such that the discharge time of the dummy read line is shortened, whereby various timing signals used for reading the memory information from the memory cells are optimized.

According to the fourteenth embodiment of the present invention, the semiconductor memory of the first embodiment further comprises a read line precharge circuit for precharging the read line with charges before information is read from the memory cell, wherein the read line precharge circuit and the dummy read line precharge circuit precharge the read line and the dummy read line, respectively, through transistors, and the transistor of the dummy read line precharge circuit has a size greater than that of the transistor of the read line precharge circuit.

With the above features, even when the load capacitance of the dummy read line is large, the precharge of the dummy read line can be completed earlier than the precharge of the read line.

According to the fifteenth embodiment of the present invention, the semiconductor memory of the first embodiment further comprises a read line precharge circuit for precharging the read line with charges before information is read from the memory cell, wherein the read line precharge circuit and the dummy read line precharge circuit precharge the read line and the dummy read line, respectively, through transistors, and the transistor of the dummy read line precharge circuit has a threshold voltage lower than that of the transistor of the read line precharge circuit.

With the above features, even when the load capacitance of the dummy read line is large, the precharge of the dummy read line can be completed earlier than the precharge of the read line. Further, the semiconductor memory can be designed such that a transistor for the precharge of the read line and a transistor for the precharge of the dummy read line have the same size.

DESCRIPTION OF THE PREFERRED EMBODIMENTS

Hereinafter, embodiments of the present invention will be described with reference to the drawings.

Embodiment 1

Figure 1:
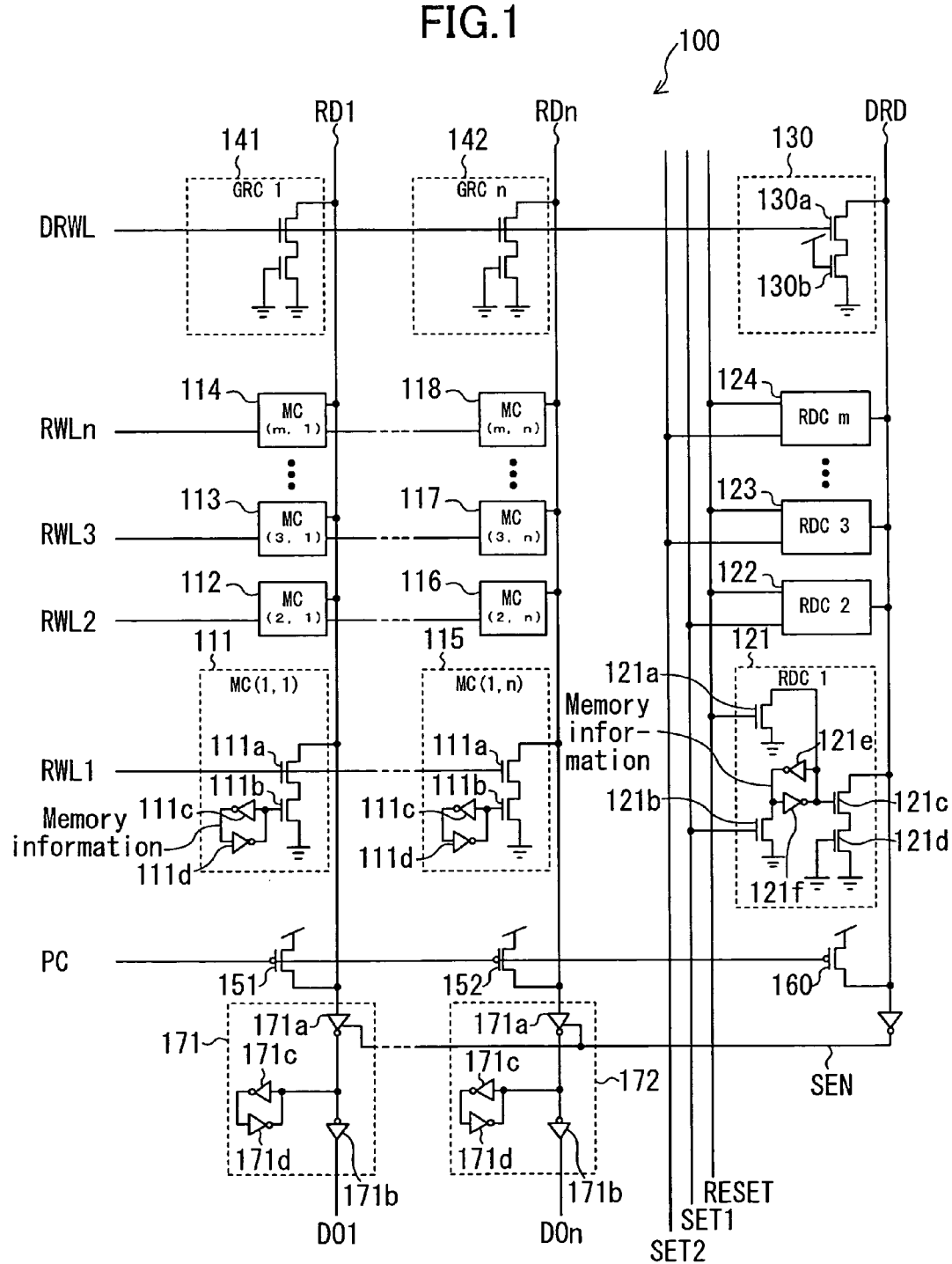
FIG. 1 is a block diagram showing a structure of a semiconductor memory according to embodiment 1 of the present invention.

FIG. 1 is a block diagram showing a structure of a semiconductor memory 100 according to embodiment 1 of the present invention. It should be noted that elements of the circuit relevant to a writing operation are not shown.

The semiconductor memory 100 includes memory cells (MC) 111 to 118, reset dummy cells (RDC) 121 to 124, a reference cell 130, gate replica cells (GRC) 141 and 142, precharge transistors 151 and 152, a dummy precharge transistor 160, and output circuits 171 and 172.

The memory cells 111 to 118 have the same structure and are arranged in a matrix of m rows by n columns. The memory cells 111 to 118 each output information stored therein to a read line connected to the memory cell (any one of read lines RD1 to RDn) according to the potential of a read word line connected to the memory cell (any one of read word lines RWL1 to RWLn). In a reading operation, any one of the read word lines RWL1 to RWLn which is selected according to an address signal (not shown) is activated.

The memory cells 111 to 118 each include transistors 111a and 111b and inverters 111c and 111d. (It should be noted that FIG. 1 only shows the detailed structures of the memory cells 111 and 115).

The transistor 111a is an N-channel MOS transistor. The transistor 111a has a drain terminal connected to a read line and a gate terminal connected to a read word line. Specifically, in the memory cell 111, the drain terminal of the transistor 111a is connected to the read line RD1, and the gate terminal of the transistor 111a is connected to the read word line RWL1.

The transistor 111b is an N-channel MOS transistor. The transistor 111b has a drain terminal connected to the source terminal of the transistor 111a and a source terminal connected to the ground potential.

The inverter 111c and inverter 111d have input terminals and output terminals cross-linked to each other as shown in FIG. 1 and store given information. The output terminal of the inverter 111d is also connected to the gate terminal of the transistor 111b.

With the above structure of the memory cells 111 to 118, when the read word line is activated, the potential of the read line is at a potential determined according to memory information. It is assumed in the following descriptions that, in a memory cell, if the transistor 111b is turned ON according to the memory information of the inverters 111c and 111d, the memory cell is considered to be holding data "0"; and if the transistor 111b is turned OFF according to the memory information of the inverters 111c and 111d, the memory cell is considered to be holding data "1".

The reset dummy cells 121 to 124 are memory cells arranged in an array of m rows. Specifically, the reset dummy cells 121 to 124 each includes transistors 121a, 121b, 121c, and 121d and inverters 121e and 121f. The transistors 121a to 121d are N-channel MOS transistors. Among these transistors, the transistor 121c has a drain terminal connected to the dummy read line DRD.

The inverter 121e and inverter 121f have input terminals and output terminals cross-linked to each other as shown in FIG. 1 and store given information. The reset dummy cells 121 to 124 having such a structure can be readily realized by changing the connections of wires of transistors present in the memory cells.

In each of the reset dummy cells 121 to 124 having the above structure, the transistor 121c connected to the dummy read line DRD is switched between ON (active) and OFF (inactive) according to signals input through the gate terminals of the transistors 121a and 121b (reset signal RESET and set signal SET1 or SET2 shown in FIG. 1). Thus, the load capacitance of the dummy read line DRD is programmably changed.

The reference cell 130 is connected to a dummy read word line DRWL and discharges the charges of the dummy read line DRD according to the potential of the dummy read word line DRWL. Specifically, the reference cell 130 includes a transistor 130a and a transistor 130b. The gate terminal of the transistor 130a is connected to the dummy read word line DRWL.

The gate replica cells 141 and 142 each have two N-channel MOS transistors as shown in FIG. 1 and serve as replicas of the gate capacitances of the memory cells 111 to 118.

The precharge transistors 151 and 152 precharge the read lines RD1 and RDn, respectively, according to precharge signal PC.

The dummy precharge transistor 160 precharges the dummy read line DRD according to precharge signal PC.

The load capacitance of the dummy read line DRD is greater than that of the read line (RD1 to RDn) due to the memory information of the reset dummy cells 121 to 124. Therefore, the dummy precharge transistor 160 has a larger size or lower threshold voltage than the precharge transistors 151 and 152.

The output circuits 171 and 172 holds and output the memory information of one of the memory cells 111 to 118, which is selected for reading, according to sense amplifier enable signal SEN (the inverse signal of the dummy read line DRD). Specifically, the output circuits 171 and 172 each includes a tri-state inverter 171a and inverters 171b to 171d.

The tri-state inverter 171a has an input terminal connected to a read line (any one of the read lines RD1 to RDn; for example, the read line RD1 in the output circuit 171). The tri-state inverter 171a is controlled by sense amplifier enable signal SEN to output through the inverter 171b a signal determined according to the potential of a read line connected thereto (i.e., a signal determined according to the memory information of a corresponding memory cell, i.e., data output DO1, DOn). It is assumed in this embodiment that, when sense amplifier enable signal SEN is at H level, the tri-state inverter 171a is active.

The inverters 171c and 171d hold the output of the tri-state inverter 171a.

Figures 2, 3:
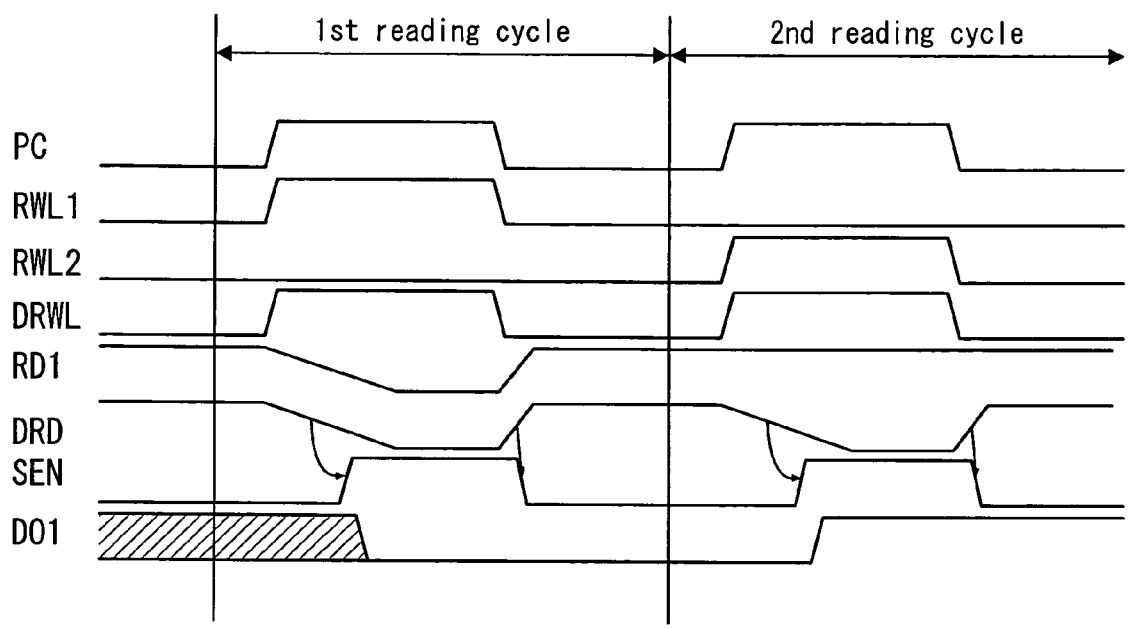
FIG. 2 is a timing chart showing the voltage waveforms of precharge signal PC, read word lines RWL1 and RWL2, etc., in a reading operation of the semiconductor memory according to embodiment 1 of the present invention.
FIG. 3 is a table which shows the relationship of the load capacitance which occurs on a dummy read line DRD, reset signal RESET, and set signals SET1 and SET2.

An operation of the semiconductor memory 100 having the above-described structure is described with reference to FIG. 2 wherein memory information of the memory cell 111 is first read out and then memory information of the memory cell 112 is read out. FIG. 2 is a timing chart showing the voltage waveforms of precharge signal PC, read word lines RWL1 and RWL2, dummy read word line DRWL, read line RD1, dummy read line DRD, sense amplifier enable signal SEN, and data output DO1 in a reading operation of the semiconductor memory 100.

It is assumed in the following descriptions that the memory information of the memory cell 111 is "0" and the memory information of the memory cell 112 is "1".

In a process of reading the memory information, the levels of reset signal RESET and set signals SET1 and SET2 are set in advance, whereby the load capacitance present on the dummy read line DRD is adjusted. For example, when the memory information of the reset dummy cells 121 to 124 are all set to "1" by setting reset signal RESET to High (H) level and setting set signals SET1 and SET2 to Low (L) level, the load capacitances present on the read lines RD1 to RDn and the dummy read line DRD have substantially the same largeness.

When precharge signal PC is pulled to L level as a preparation for a reading operation, the potential of the read line RD1 is precharged to the supply potential by the precharge transistor 151. The potential of the dummy read line DRD is precharged to the supply potential by the dummy precharge transistor 160.

At the start of a reading cycle for the memory cell 111 (first reading cycle shown in FIG. 2), precharge signal PC is pulled to H level as illustrated in FIG. 2, so that the precharge operation is interrupted. Meanwhile, the read word line RWL1 and the dummy read word line DRWL are activated at the same time according to the address signal.

When the read word line RWL1 is activated, the charges of the read line RD1 which have been precharged by the precharge transistor 151 are discharged because the memory information of the memory cell 111 is "0". When the dummy read word line DRWL is activated, the charges of the dummy read line DRD which have been precharged by the dummy precharge transistor 160 are also discharged.

When the charges of the dummy read line DRD are discharged, sense amplifier enable signal SEN transitions to H level. As a result, the tri-state inverter 171*a* becomes inactive so that a L-level signal (information) is held as data output DO1.

At a predetermined time period after the output circuit 171 has output data output DO1, the read word line RWL1, the dummy read word line DRWL, and precharge signal PC are pulled to L level as a preparation for the next reading cycle (second reading cycle). The output circuit 171 maintains data output DO1 at L level at the same time.

After the start of the second reading cycle, precharge signal PC is pulled to H level so that the precharge operation is interrupted. Meanwhile, the read word line RWL2, which is to be selected in this cycle, and the dummy read word line DRWL are activated at the same time according to the address signal.

Since the memory information of the memory cell 112 is "1", the charges of the read line RD1 which have been precharged in advance are not discharged. Meanwhile, the charges of the dummy read line DRD which have been precharged by the reference cell 130 are discharged.

When the charges of the dummy read line DRD are discharged, sense amplifier enable signal SEN transitions to H level. As a result, the output circuit 171 holds a H-level signal (information) as data output DO1.

As described above, in the semiconductor memory 100, sense amplifier enable signal SEN transitions according to the charges of the dummy read line DRD. That is, in the semiconductor memory 100, the timing of reading is adjusted according to the charges of the dummy read line DRD.

In the example described above, the memory information of the reset dummy cells 121 to 124 are all set to "1". Therefore, the load capacitances present on the read lines RD1 to RDn and the dummy read line DRD have substantially the same largeness.

However, variations in the load capacitances present on the read lines RD1 to RDn and the dummy read line DRD become large according to the temperature condition, voltage condition, the time period of use of a chip, etc.

For example, if the semiconductor memory 100 operates at a low voltage, it is likely that the discharge time of the read line RD1 is greatly different from that of the dummy read line DRD. If the discharge time of the read line RD is longer than that of the dummy read line DRD, the time necessary for the potential of the read line RD1 to transition to an intermediate potential can be sometimes long even when sense amplifier enable signal SEN transitions to H level. In this case, large through currents flow through the tri-state inverters 171*a* of the output circuits 171 and 172, whereby the power is consumed. Therefore, under the conditions which incur large variations, it is necessary to provide, in advance, a long discharge time of the reference cell 130 for the dummy read line DRD.

In the semiconductor memory 100, the load capacitance which occurs on the dummy read line DRD is changed according to reset signal RESET and set signals SET1 and SET2 which are input to the reset dummy cells 121 to 124 such that the discharge time of the dummy read line DRD is changed. The table of FIG. 3 shows the relationship of the load capacitance which occurs on the dummy read line DRD, reset signal RESET, and set signals SET1 and SET2. In this table, the column of "RESET CELL LOAD CAPACITANCE" expresses the difference in load capacitance by the number of transistors connected to the dummy read line DRD.

For example, when reset signal RESET is at H level while both set signals SET1 and SET2 are at L level (initial state), the load capacitances present on the read lines RD1 to RDn and the dummy read line DRD have substantially the same largeness as previously described.

If the conditions change from the above-described initial state such that reset signal RESET transitions to L level, set signal SET1 transitions to H level, and set signal SET2 transitions to L level, the transistors 121*c* (N-channel MOS transistors) of the reset dummy cells 121 and 122, which are connected to the dummy read line DRD, are activated, so that the diffusion capacitances of the two serially-connected N-channel MOS transistors are connected to the dummy read line DRD.

If the conditions change from the above-described initial state such that reset signal RESET transitions to L level, set signal SET1 transitions to L level, and set signal SET2 transitions to H level, the transistors 121*c* (N-channel MOS transistors) of the reset dummy cells 123 and 124, which are connected to the dummy read line DRD, are activated, so that the diffusion capacitances of the m−2 serially-connected N-channel MOS transistors are connected to the dummy read line DRD.

If the conditions change from the above-described initial state such that reset signal RESET transitions to L level, set signal SET1 transitions to H level, and set signal SET2 transitions to H level, the transistors 121*c* (N-channel MOS transistors) of the reset dummy cells 121 to 124, which are connected to the dummy read line DRD, are activated, so that the diffusion capacitances of the m serially-connected N-channel MOS transistors are connected to the dummy read line DRD.

The reset dummy cells 121 to 124 are controlled according to reset signal RESET and set signals SET1 and SET2 as described above, the number of N-channel MOS transistors connected to the dummy read line DRD is changed, whereby the load capacitance of the dummy read line DRD is changed among four levels.

Therefore, according to this embodiment, the load capacitance of the dummy read line DRD is programmably changed, such that information can be read at an optimum timing even in a temperature or voltage condition under which the transistor capacity of the memory cells 111 to 118 is likely to greatly vary. For example, when the semiconductor memory is used under a low voltage condition or high temperature condition where variations in factors among the memory cells 111 to 118 are expected to be large, the memory information of the reset dummy cells 121 to 124 are set in advance based on external information such that the dummy read line DRD has a large load capacitance, which results in a stable reading operation.

Although in this embodiment two set signals are supplied to the reset dummy cells 121 to 124, three or more signals may be used in such a manner that combinations of the load capacitances of the read dummy lines are prepared based on the three or more signals in order to control the load capacitance with higher resolution with respect to the temperature condition, voltage condition, etc.

Embodiment 2

Figure 4:
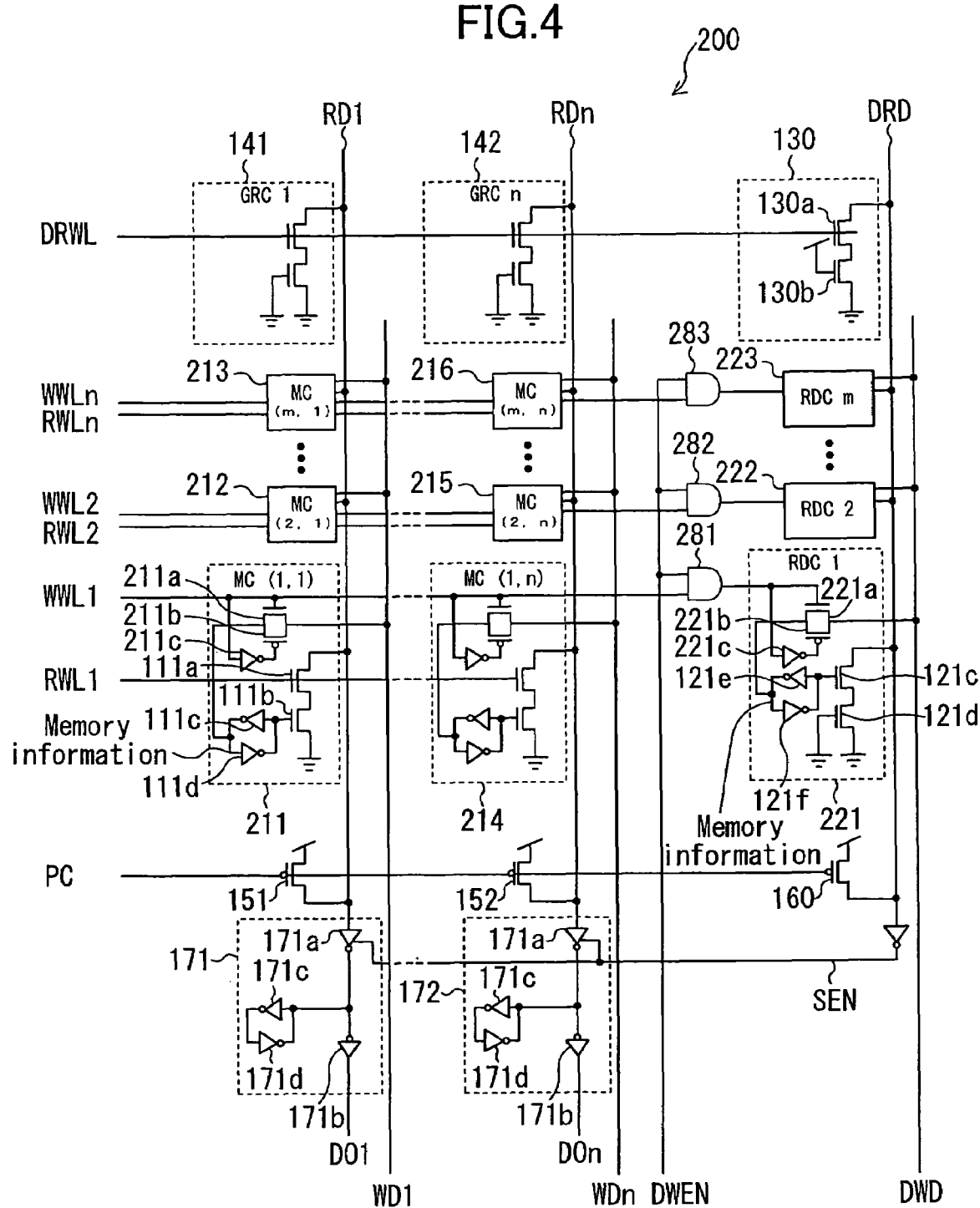
FIG. 4 is a block diagram showing a structure of a semiconductor memory according to embodiment 2 of the present invention.

FIG. 4 is a block diagram showing a structure of a semiconductor memory 200 according to embodiment 2 of the present invention. The semiconductor memory 200 is different from the semiconductor memory 100 in that the semiconductor memory 200 includes memory cells 211 to 216 in place of the memory cells 111 to 118 and reset dummy cells 221 to 223 in place of the reset dummy cells 121 to 124 and further includes AND circuits 281 to 283. In the following descriptions of this embodiment, elements having the same functions as those of embodiment 1 are denoted by the same reference numerals, and the descriptions thereof are herein omitted.

The memory cells 211 to 216 have the same structure and are arranged in a matrix of m rows by n columns. The memory cells 211 to 216 each output information stored therein to a read line connected to the memory cell (any one of read lines RD1 to RDn) according to the potential of a read word line connected to the memory cell (any one of read word lines RWL1 to RWLn).

Each memory cell is controlled by a write word line connected thereto (any one of the write word lines WWL1 to WWLn) to store (write) in the inverters 111c and 111d information determined according to the potential of a write line connected to the memory cell (any one of the write lines WD1 to WDn). It should be noted that, in a writing operation, one of the write word lines WWL1 to WWLn which is selected by an address signal (not shown) is activated.

Now, the detailed structure of the memory cell is described with the memory cell 211 as an example. The memory cell 211 includes transistors 211a and 211b and an inverter 211c in addition to the components of the memory cell 111 of embodiment 1. The transistor 211a is an N-channel MOS transistor, and the transistor 211b is a P-channel MOS transistor. In the memory cell 211, the transistors 211a and 211b are connected to the write word line WWL1 and the write line WD1 as shown in FIG. 4. That is, the transistors 211a and 211b are controlled by the potential of the write word line WWL1 such that information determined according to the potential of the write line WD1 is written in the inverters 111c and 111d.

The reset dummy cells 221 to 223 are arranged in an array of m rows as shown in FIG. 4. In each of the reset dummy cells 221 to 223, when a write word line connected to the reset dummy cell is activated while dummy write enable signal DWEN is at H level, information determined according to the level (H level or L level) of a dummy write line DWD is written in the reset dummy cell.

Specifically, each of the reset dummy cells 221 to 223 includes transistors 121c and 121d, inverters 121e and 121f, transistors 221a and 221b, and an inverter 221c. (It should be noted that in FIG. 4 only the structure of the reset dummy cell 221 is described in detail).

The transistor 221a is an N-channel MOS transistor which has a gate terminal connected to the output terminal of the AND circuit 281. The transistor 221b is a P-channel MOS transistor which has a gate terminal connected to the output terminal of the AND circuit 281 through the inverter 221c.

Each of the AND circuits 281 to 283 has an input terminal connected to the write word lines WWL1 to WWLn and the other input terminal connected to dummy write enable signal DWEN.

When reading memory information from the semiconductor memory 200 having the above-described structure, predetermined information are set in the reset dummy cells 221 to 223 such that the load capacitance present on the dummy read line DRD is adjusted.

Figure 5:
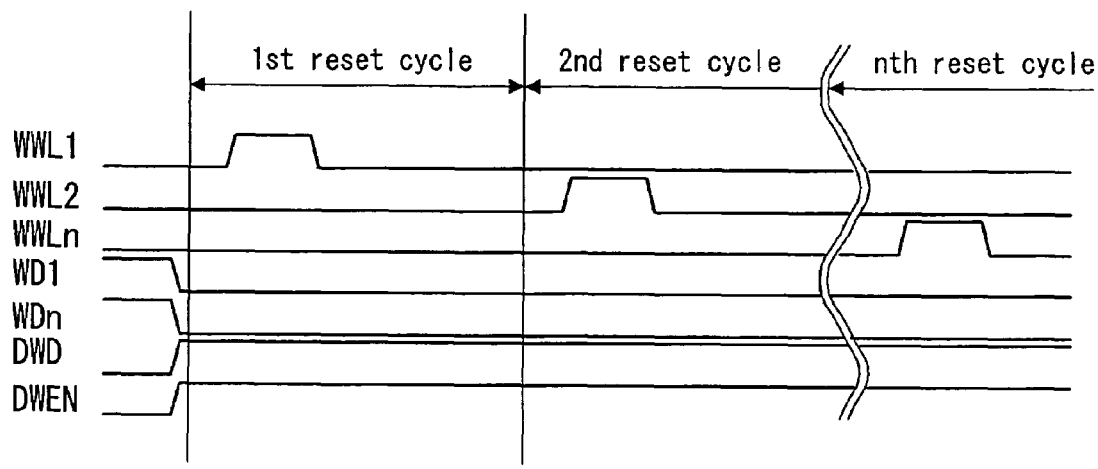
FIG. 5 is a timing chart showing the voltage waveforms of write word lines, write lines, etc., in an operation of initializing memory information of reset dummy cells in the semiconductor memory according to embodiment 2 of the present invention.

FIG. 5 is a timing chart showing the voltage waveforms of the write word lines WWL1, WWL2 and WWLn, write lines WD1 and WDn, dummy write line DWD, and dummy write enable signal DWEN in the case where, in the initialization, all the memory information of the memory cells 211 to 216 are initialized to "0", and all the memory information of the reset dummy cells 221 to 223 are initialized to "1". That is, the write word lines WWL1 to WWLn are sequentially activated while the write lines WD1 to WDn are set to L level, the dummy write line DWD is set to H level, and dummy write enable signal DWEN is set to H level, whereby the memory information of the memory cells 211 to 216 are all initialized to "0", and the memory information of the reset dummy cells 221 to 223 are all initialized to "1".

For example, the memory information of the reset dummy cell 221 may be set to "0" by activating the write word line WWL1 while the dummy write line DWD is set to L level and dummy write enable signal DWEN is set to H level.

That is, in the semiconductor memory 200, before the conditions change to increase variations, for example, before the voltage decreases, the memory information of the reset dummy cells are changed to increase the load capacitance of the dummy read line, whereby the discharge time of the dummy read line DRD is prolonged.

Figure 6:
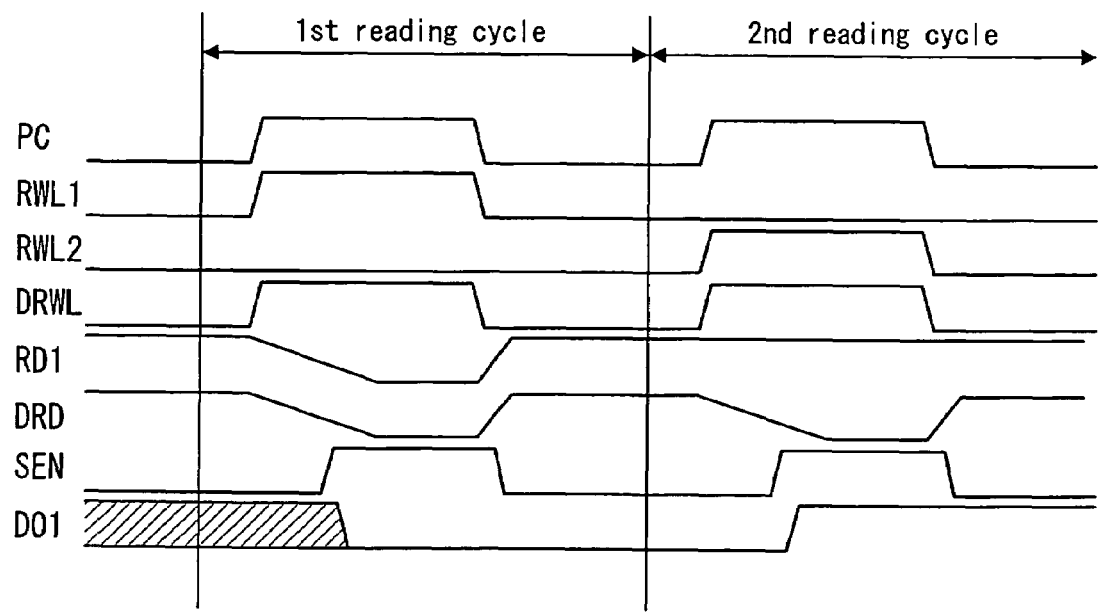
FIG. 6 is a timing chart showing the voltage waveforms of precharge signal PC, read word lines RWL1 and RWL2, etc., in a reading operation of the semiconductor memory according to embodiment 2 of the present invention.

Thus, after the load capacitance present on the dummy read line DRD is adjusted, the operations of the reading cycles described for the semiconductor memory 100 (first and second reading cycles shown in FIG. 6) are also carried out in the semiconductor memory 200, such that information are read out at optimum timings even in a temperature or voltage condition under which the transistor capacity is likely to greatly vary.

In the semiconductor memory 200, memory information is written in a reset dummy cell through the dummy write line DWD, and therefore, the increase of the wiring resources is small.

The difference between the memory cell and the reset dummy cell is only the connection of the gate terminal of an N-channel MOS transistor which is connected in series to the dummy read line or the read line. Therefore, the wire shape of the dummy read line DRD and the wire shape of the read line RD can be substantially the same. Thus, the accuracy in timing of transition of sense amplifier enable signal SEN can be further improved.

Embodiment 3

Figure 7:
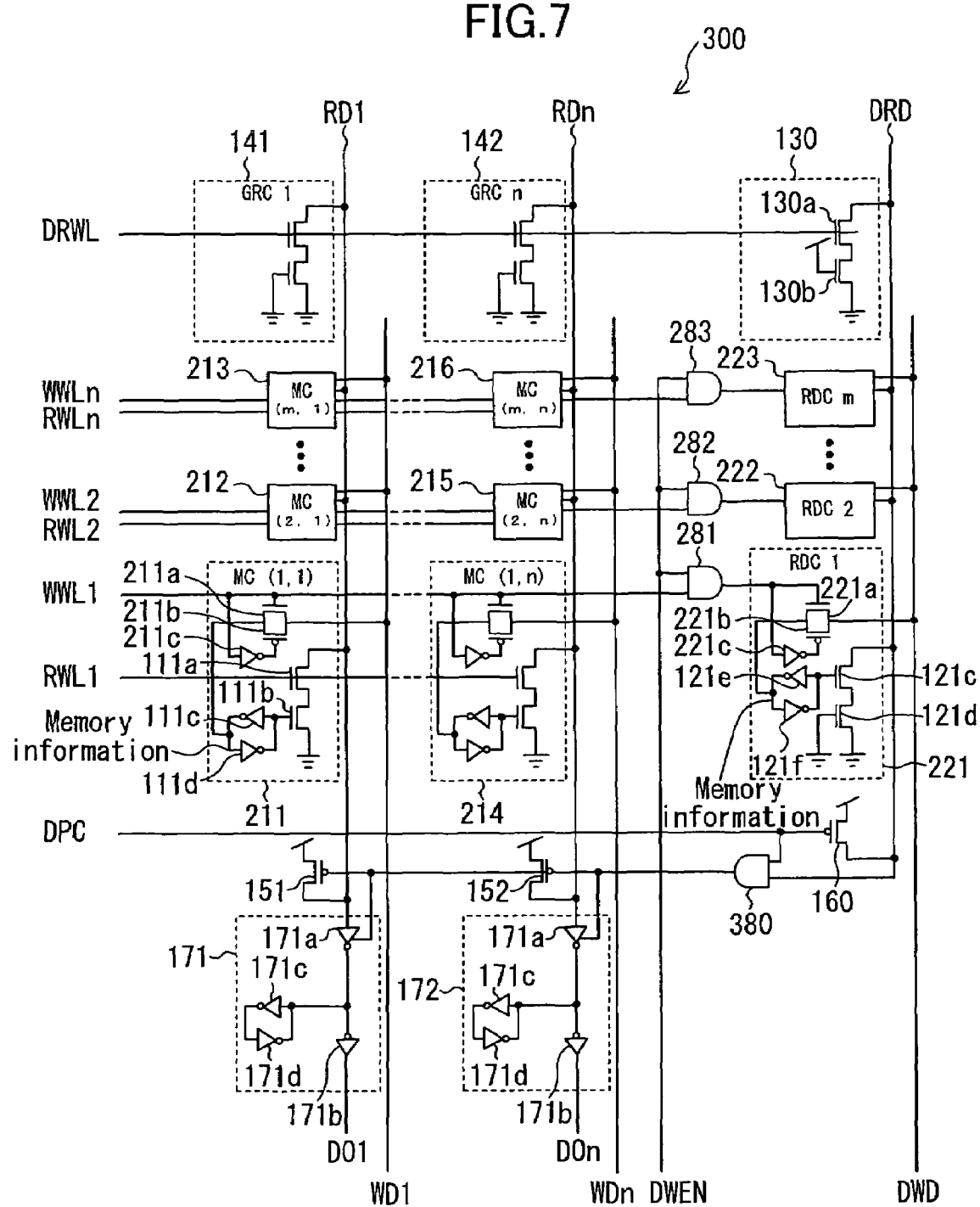
FIG. 7 is a block diagram showing a structure of a semiconductor memory according to embodiment 3 of the present invention.

FIG. 7 is a block diagram showing a structure of a semiconductor memory 300 according to embodiment 3 of the present invention. As shown in FIG. 7, the semiconductor memory 300 includes an AND circuit 380 in addition to the components of the semiconductor memory 200.

Due to the addition of the AND circuit 380, the precharge operation by the precharge transistors 151 and 152 is controlled by dummy precharge signal DPC and the potential of the dummy read line DRD.

An operation of the semiconductor memory 300 having the above-described structure is described with reference to FIG. 8.

Figure 8:
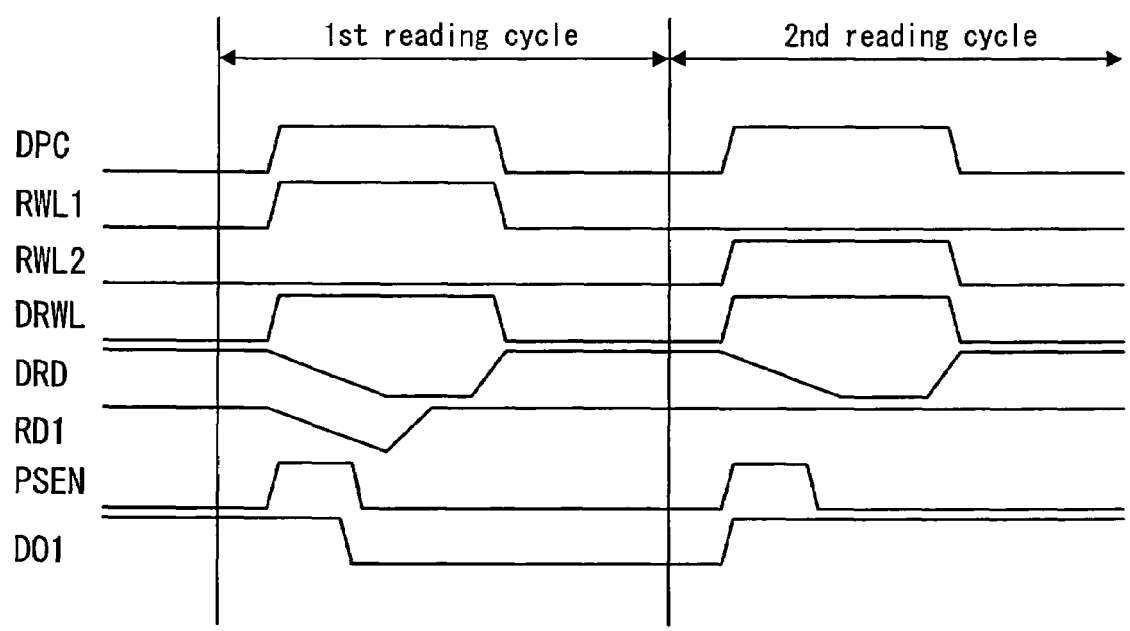
FIG. 8 is a timing chart showing the voltage waveforms of read word lines RWL1 and RWL2, etc., in a reading operation of the semiconductor memory according to embodiment 3 of the present invention.

FIG. 8 is a timing chart showing the voltage waveforms of dummy precharge signal DPC, the read word lines RWL1 and RWL2, the dummy read word line DRWL, the dummy read line DRD, the read line RD1, precharge sense amplifier enable signal PSEN (which is the inverse of the dummy read line), and data output DO1 in a reading operation. It should be noted that, in the following descriptions, the memory information of the memory cell 211 is "0".

When reading memory information from the semiconductor memory 300, predetermined information are set in the reset dummy cells 221 to 223, whereby the load capacitance present on the dummy read line DRD is adjusted.

Before the start of the first reading cycle, dummy precharge signal DPC is pulled to L level as a preparation for the reading operation, and accordingly, the potential of the read line RD1 is precharged to the supply potential by the precharge transistor 151. The potential of the dummy read line DRD is precharged to the supply potential by the dummy precharge transistor 160.

For example, at the start of the reading cycle for the memory cell 211 (first reading cycle shown in FIG. 8), dummy precharge signal DPC is pulled to H level, so that the output of the AND circuit 380 (precharge sense amplifier enable signal PSEN) transitions to H level, because the potential of the dummy read line DRD has been precharged to the supply potential. As a result, the precharge operation of the read line RD is interrupted.

Meanwhile, the read word line RWL1 which is to be selected and the dummy read word line DRWL are activated at the same time by the address signal.

When the read word line RWL1 is activated, the charges of the read line RD1 which have been precharged by the precharge transistor 151 are discharged because the memory information of the memory cell 211 is "0". When the dummy read word line DRWL is activated, the charges of the dummy read line DRD which have been precharged by the dummy precharge transistor 160 are also discharged.

When the charges of the dummy read line DRD are discharged, precharge sense amplifier enable signal PSEN transitions to L level, so that the precharge of the read line RD is started. On the other hand, the tri-state inverter 171a of the output circuit 171 becomes inactive, so that an L-level signal is held as data output DO1.

In the case where the reading operation is still continued, at a predetermined time interval after data output DO1 is output, the read word line RWL1, the dummy read word line DRWL and dummy precharge signal PC are pulled to L level as a preparation for the next cycle (second reading cycle).

As described above, also in this embodiment, information are read out at optimum timings even in a temperature or voltage condition under which the transistor capacity is likely to greatly vary.

Since the start of the precharge operation is triggered by the timing of discharging the dummy read line DRD, data can be output with the least necessary precharge interruption interval. That is, in this embodiment, the precharge start time can be moved up to an earlier timing.

Therefore, in this embodiment, the size of the precharge transistors 151 and 152 can be small as compared with the semiconductor memories of embodiments 1 and 2. As a result, the diffuse capacitances of the precharge transistors 151 and 152 connected to the read line RD become small so that the discharge time is shortened, and the operation speed is hence improved.

If the discharge time of the dummy read line DRD were shorter than that of the read line RD, the start of the precharge triggered by the discharge of the dummy read line DRD could result in a failure of reading. In view of such, according to embodiment 3, as in embodiments 1 and 2, if under conditions that increase variations, such as low voltage, high temperature, etc., the number of memory cells whose memory information is "0" is increased such that the discharge time of the dummy read line DRD is prolonged, whereby a stable reading operation is realized.

Embodiment 4

A semiconductor memory of embodiment 4 includes a feature for controlling the timing of deactivating the read word lines RWL1 to RWLn in addition to the components of the semiconductor memory of embodiment 3.

Figure 9:
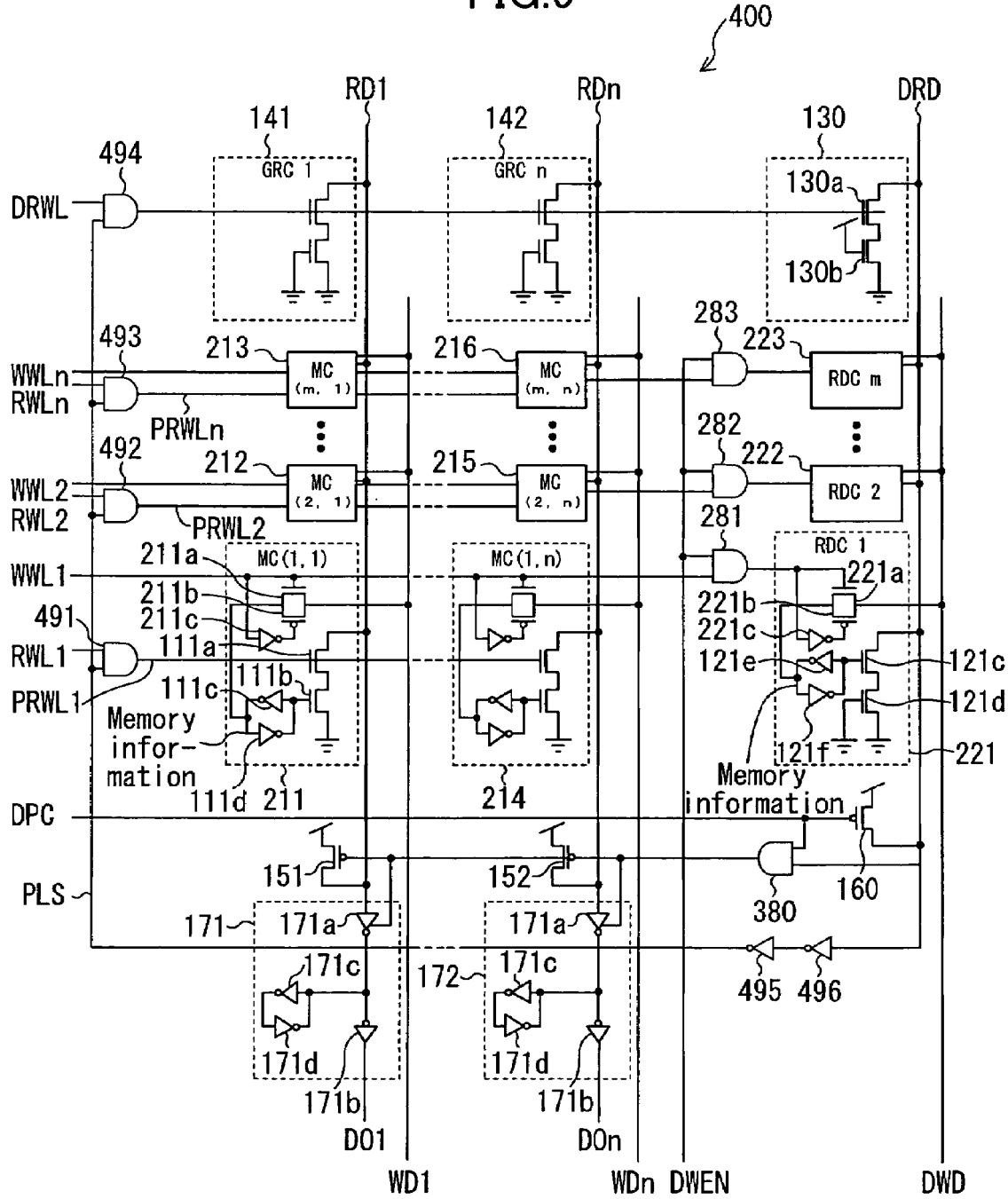
FIG. 9 is a block diagram showing a structure of a semiconductor memory according to embodiment 4 of the present invention.

FIG. 9 is a block diagram showing a structure of a semiconductor memory 400 according to embodiment 4 of the present invention. The semiconductor memory 400 includes, as shown in FIG. 9, AND circuits 491 to 494 and inverters 495 and 496 in addition to the components of the semiconductor memory 300.

The AND circuits 491 to 493 each has an input terminal connected to the read word line (RWL1 to RWLn). The other input terminal of each of the AND circuits 491 to 493 is connected to the dummy read line DRD through the inverters 495 and 496. The outputs of the AND circuits 491 to 493 are connected to read word lines for the reset dummy cells 221 to 223 (pulse read word lines PRWL1 to PRWLn).

The AND circuit 494 has an input terminal connected to the dummy read word line DRWL and the other input terminal connected to the dummy read line DRD through the inverters 495 and 496. The output of the AND circuit 494 is connected to the dummy read word line DRWL for gate replica cells 141 and 142 and the reference cell 130 (pulse dummy read word line PDRWL).

The inverters 495 and 496 reshape the waveform of a signal on the dummy read line DRD to output the reshaped signal as control signal PLS.

When reading memory information from the semiconductor memory 400 having the above-described structure, predetermined information are also set in the reset dummy cells 221 to 223, whereby the load capacitance present on the dummy read line DRD is adjusted. Meanwhile, the potentials of the read line RD1 and the dummy read line DRD are precharged to the supply potential.

Figure 10:
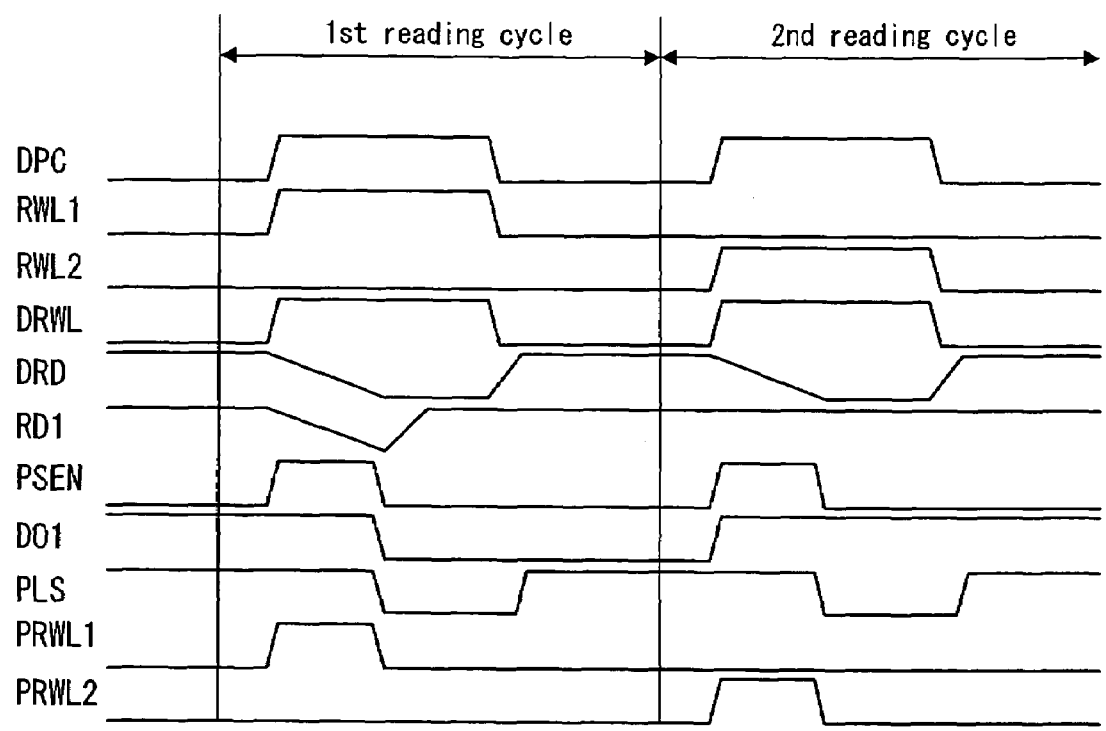
FIG. 10 is a timing chart showing the voltage waveforms of read word lines RWL1 and RWL2, etc., in a reading operation of the semiconductor memory according to embodiment 4 of the present invention.
Figure 11:
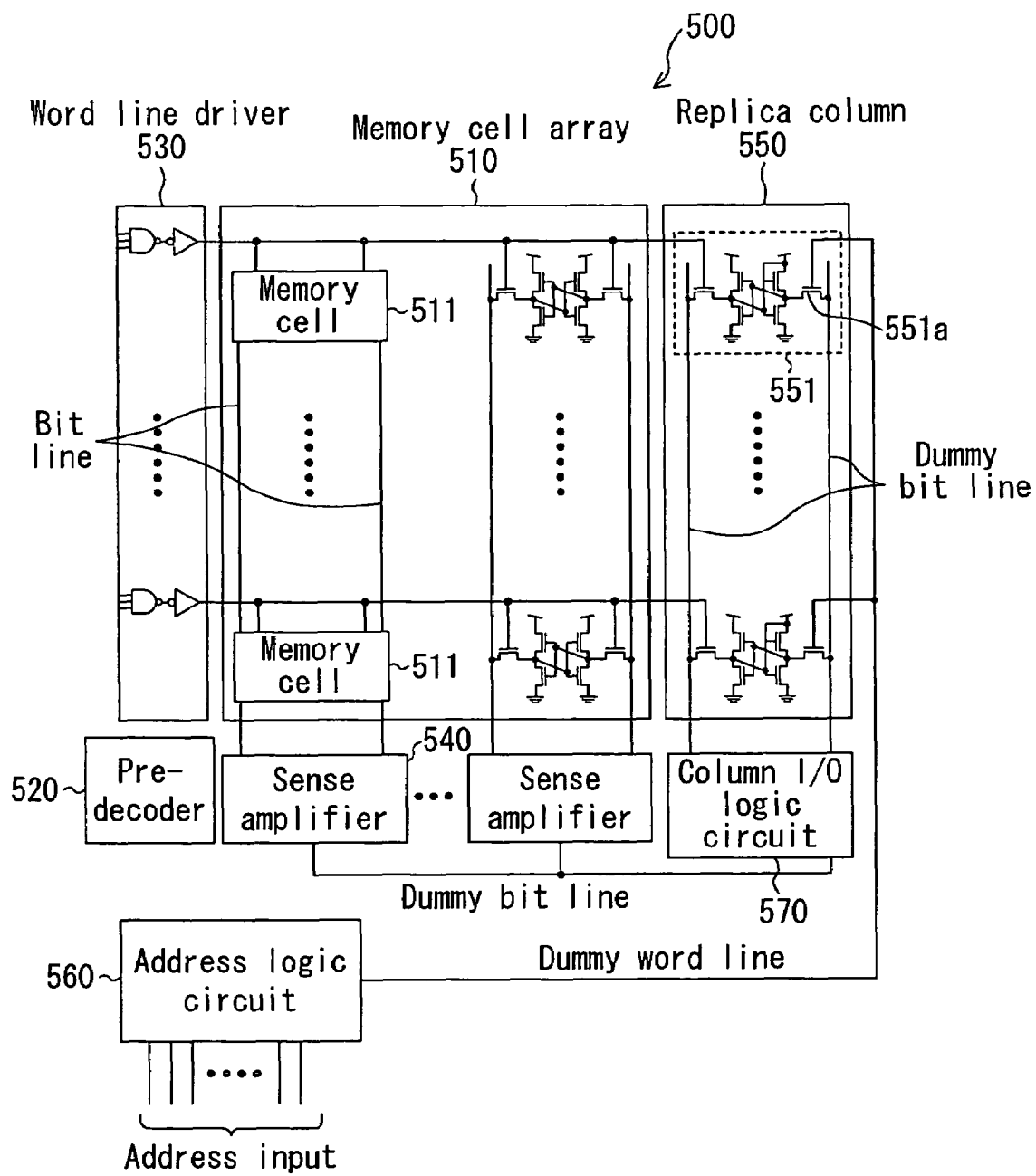
FIG. 11 is a block diagram showing a structure of a conventional semiconductor memory.

Thereafter, for example, a reading cycle is started for reading information from the memory cell 211, the read word line RWL1, dummy read word line DRWL, and dummy precharge signal DPC are pulled to H level as illustrated in FIG. 10 (first reading cycle).

Accordingly, precharge sense amplifier enable signal PSEN transitions to H level, so that the memory information of the memory cell 211 is held by the output circuit 171 and then output therefrom. At the same time, the precharge operation is interrupted, and the discharge of the dummy read line DRD is started. When the dummy read line DRD is discharged so that its potential transitions to L level, precharge sense amplifier enable signal PSEN transitions to L level, so that the precharge transistor 151 is activated.

Meanwhile, when the discharge of the dummy read line DRD is started, control signal PLS transitions to L level. As a result, the read word line RWL1 and the pulse read word line PRWL1, which is the logical product of the read word line RWL1 and control signal PLS, transition to L level. (That is, deactivation of the pulse read word line PRWL1 is triggered by the start of the discharge of the dummy read line DRD.)

As described above, according to this embodiment, it is possible to greatly reduce the possibility of simultaneously activating the precharge transistors 151 and 152 and the pulse read word lines (PRWL1 to PRWL). Therefore, occurrence of a through current can be suppressed to reduce the power consumption, and the man-hour for designing circuitry such that occurrence of a through current is suppressed can also be reduced.

It should be noted that the levels and meanings of the signals described in the above embodiments are merely exemplary and are not limited to the above-described examples.

As described above, a semiconductor memory of the present invention is advantageous in that a stable operation is achievable even when the performance of transistors of the semiconductor memory varies due to a decrease in voltage, a temperature variation, or the like, and is useful as, for example, a semiconductor memory which precharges a bit line to a predetermined potential for reading data.

What is claimed is:

1. A semiconductor memory, comprising:
a memory cell array including memory cells arranged in a matrix configuration;
read word lines connected to rows of the memory cell array on a one-to-one basis, the read word lines transmitting a read control signal to the memory cells;
read lines connected to columns of the memory cell array on a one-to-one basis, the read lines transmitting information output from the memory cells;
a dummy cell array including a plurality of dummy memory cells for storing given information;
a dummy read line to which the plurality of dummy memory cells are commonly connected;
a dummy read line precharge circuit for precharging the dummy read line with charges; and
a discharge circuit for discharging the charges of the dummy read line precharged by the dummy read line precharge circuit,
wherein the dummy memory cells change the load capacitance of the dummy read line according to information stored therein, and
reading of information from the memory cells is controlled according to a change in potential of the dummy read line due to the discharge of the discharge circuit.

2. The semiconductor memory of claim 1, wherein:
each of the memory cells includes
a memory cell information storage section formed by two inverter circuits whose input terminals and output terminals are cross-linked to each other,
a first memory cell transistor having a gate terminal connected to the read word line and a drain terminal connected to the read line, and
a second memory cell transistor having a gate terminal connected to a connection point between the two inverter circuits, a drain terminal connected to a source terminal of the first memory cell transistor, and a source terminal connected to a first power supply; and
each of the dummy memory cells includes
a dummy memory cell information storage section formed by two inverter circuits whose input terminals and output terminals are cross-linked to each other,
a first dummy memory cell transistor having a gate terminal connected to a ground and a source terminal connected to a second power supply, and
a second dummy memory cell transistor having a drain terminal connected to the dummy read line, a source terminal connected to a drain terminal of the first dummy memory cell transistor, and a gate terminal connected to a connection point between the two inverter circuits of the dummy memory cell information storage section.

3. The semiconductor memory of claim 1, wherein:
the discharge circuit includes
a first discharge transistor having a source terminal connected to a ground potential and a gate terminal connected to a third power supply, and
a second discharge transistor having a drain terminal connected to the dummy read line and a source terminal connected to a drain terminal of the first discharge transistor; and
the discharge of the discharge circuit is triggered by activation of the gate terminal of the second discharge transistor.

4. The semiconductor memory of claim 1, wherein the first memory cell transistor, the second memory cell transistor, the first dummy memory cell transistor, and the second dummy memory cell transistor have the same shape.

5. The semiconductor memory of claim 3, wherein a potential of the third power supply is higher than that of the first power supply.

6. The semiconductor memory of claim 3, wherein the first memory cell transistor, the second memory cell transistor, the first discharge transistor, and the second discharge transistor have the same shape.

7. The semiconductor memory of claim 2, wherein:
the dummy memory cell further includes:
a first information set transistor having a drain terminal connected to one of connection points of the two cross-linked inverter circuits and a source terminal connected to a ground potential, and
a second information set transistor having a drain terminal connected to the other of the connection points of the two cross-linked inverter circuits and a source terminal connected to the ground potential; and
information is stored in the dummy memory cell by controlling the potentials of the gate terminals of the first information set transistor and the second information set transistor.

8. The semiconductor memory of claim 1, further comprising:
write word lines connected to rows of the memory cells of the memory cell array on a one-to-one basis, the write word lines transmitting a write control signal to the memory cells; and
a dummy write line to which the plurality of dummy memory cells are commonly connected, the dummy write line transmitting information which is to be written in the dummy memory cells, wherein the dummy memory cell is connected to the write word line and stores information input through the dummy write line according to a control signal input through the write word line.

9. The semiconductor memory of claim 1, further comprising an output circuit for outputting information output to the read line according to a change in potential of the dummy read line due to the discharge of the discharge circuit.

10. The semiconductor memory of claim 1, further comprising a read line precharge circuit for precharging the read line with charges according to a change in potential of the dummy read line due to the discharge of the discharge circuit.

11. The semiconductor memory of claim 1, wherein the read control signal is interrupted according to a change in potential of the dummy read line due to the discharge of the discharge circuit, such that the read word line is deactivated.

12. The semiconductor memory of claim 1, wherein information stored in the dummy memory cell is changed according to the temperature of the semiconductor memory.

13. The semiconductor memory of claim 1, wherein information stored in the dummy memory cell is changed according to a supply voltage supplied to the semiconductor memory.

14. The semiconductor memory of claim 1, further comprising a read line precharge circuit for precharging the read line with charges before information is read from the memory cell, wherein the read line precharge circuit and the dummy read line precharge circuit precharge the read line and the dummy read line, respectively, through transistors, and the transistor of the dummy read line precharge circuit has a size greater than that of the transistor of the read line precharge circuit.

15. The semiconductor memory of claim 1, further comprising a read line precharge circuit for precharging the read line with charges before information is read from the memory cell, wherein the read line precharge circuit and the dummy read line precharge circuit precharge the read line and the dummy read line, respectively, through transistors, and the transistor of the dummy read line precharge circuit has a threshold voltage lower than that of the transistor of the read line precharge circuit.

* * * * *